United States Patent
Yang et al.

(10) Patent No.: US 8,110,453 B2
(45) Date of Patent: Feb. 7, 2012

(54) LOW TEMPERATURE THIN FILM TRANSISTOR PROCESS, DEVICE PROPERTY, AND DEVICE STABILITY IMPROVEMENT

(75) Inventors: Ya-Tang Yang, Cupertino, CA (US);
Beom Soo Park, San Jose, CA (US);
Tae Kyung Won, San Jose, CA (US);
Soo Young Choi, Fremont, CA (US);
John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 267 days.

(21) Appl. No.: 12/425,228

(22) Filed: Apr. 16, 2009

(65) Prior Publication Data
US 2009/0261331 A1 Oct. 22, 2009

Related U.S. Application Data

(60) Provisional application No. 61/045,821, filed on Apr. 17, 2008.

(51) Int. Cl.
*H01L 21/84* (2006.01)
*H01L 21/336* (2006.01)
*H01L 21/20* (2006.01)
*H01L 29/786* (2006.01)

(52) U.S. Cl. ............... 438/158; 438/482; 257/E21.414; 257/E29.291; 257/57

(58) Field of Classification Search .............. 438/158, 438/482; 257/57, E21.412, E21.414, E29.291
See application file for complete search history.

(56) References Cited

U.S. PATENT DOCUMENTS

| | | | | |
|---|---|---|---|---|
| 5,041,888 | A | * | 8/1991 | Possin et al. .................. 257/59 |
| 5,273,920 | A | | 12/1993 | Kwasnick et al. |
| 5,530,265 | A | | 6/1996 | Takemura |
| 5,663,576 | A | | 9/1997 | Shimizu |
| 5,744,817 | A | * | 4/1998 | Shannon .................. 257/29 |
| 5,834,345 | A | * | 11/1998 | Shimizu .................. 438/158 |
| 6,064,091 | A | | 5/2000 | Deane et al. |
| 6,130,119 | A | * | 10/2000 | Jinnai ...................... 438/155 |
| 6,180,438 | B1 | * | 1/2001 | Deane et al. .............. 438/149 |
| 6,331,717 | B1 | | 12/2001 | Takemura |
| 6,338,874 | B1 | * | 1/2002 | Law et al. ............... 427/255.18 |

(Continued)

FOREIGN PATENT DOCUMENTS
JP 2005-045139 2/2005

OTHER PUBLICATIONS

International Search Report and Written Opinion of the International Searching Authority mailed Dec. 24, 2009, in International Application No. PCT/US2009/040811.

(Continued)

*Primary Examiner* — Mary Wilczewski
(74) *Attorney, Agent, or Firm* — Patterson & Sheridan, L.L.P.

(57) ABSTRACT

A method and apparatus for forming a thin film transistor is provided. A gate dielectric layer is formed, which may be a bilayer, the first layer deposited at a low rate and the second deposited at a high rate. In some embodiments, the first dielectric layer is a silicon rich silicon nitride layer. An active layer is formed, which may also be a bilayer, the first active layer deposited at a low rate and the second at a high rate. The thin film transistors described herein have superior mobility and stability under stress.

13 Claims, 3 Drawing Sheets

U.S. PATENT DOCUMENTS

| | | | |
|---|---|---|---|
| 6,355,943 B1 * | 3/2002 | Sung .............................. | 257/72 |
| 6,525,341 B1 * | 2/2003 | Tsujimura et al. ............. | 257/59 |
| 6,558,987 B2 * | 5/2003 | Lee .............................. | 438/149 |
| 6,645,826 B2 * | 11/2003 | Yamazaki et al. ............ | 438/439 |
| 6,753,550 B2 * | 6/2004 | Tsujimura et al. ............ | 257/59 |
| 6,800,502 B2 * | 10/2004 | Sung .............................. | 438/40 |
| 6,878,967 B2 * | 4/2005 | Sung .............................. | 257/72 |
| 7,115,448 B2 * | 10/2006 | Tsujimura et al. ............ | 438/149 |
| 7,125,758 B2 * | 10/2006 | Choi et al. ................... | 438/151 |
| 7,372,113 B2 * | 5/2008 | Tanaka et al. ................ | 257/411 |
| 7,553,707 B2 * | 6/2009 | Horino et al. ................ | 438/149 |
| 7,871,940 B2 * | 1/2011 | Schropp et al. .............. | 438/778 |
| 7,884,035 B2 * | 2/2011 | Park et al. .................... | 438/792 |
| 2001/0012648 A1 | 8/2001 | Lee | |
| 2004/0129941 A1 | 7/2004 | Dokumaci et al. | |
| 2005/0247982 A1 | 11/2005 | Bhattacharyya | |
| 2006/0145161 A1 | 7/2006 | Lee et al. | |
| 2006/0186409 A1 * | 8/2006 | Horino et al. ................ | 257/59 |
| 2008/0012065 A1 | 1/2008 | Kumar | |
| 2008/0128871 A1 * | 6/2008 | Schropp et al. .............. | 257/649 |
| 2008/0138949 A1 | 6/2008 | Fumitake | |
| 2008/0158635 A1 | 7/2008 | Hagood et al. | |
| 2008/0268175 A1 * | 10/2008 | Park et al. .................... | 427/579 |
| 2009/0090913 A1 | 4/2009 | Walker | |
| 2009/0261331 A1 * | 10/2009 | Yang et al. .................... | 257/57 |
| 2010/0163862 A1 * | 7/2010 | Yang et al. .................... | 257/43 |

OTHER PUBLICATIONS

Sanghun Jeon, et al.; High Work-Function Metal Gate and High-k Dielectrics for Charge Trap Flash Memory Device Applications; IEEE Transactions on Electron Devices, vol. 52, No. 12, Dec. 2005, pp. 2654-2659.

M. J. Powell; Charge Trapping Instabilities in Amorphous Silicon-Silicon Nitride Thin-Film Transistors; Appl. Phys. Lett. 43 (6), Sep. 15, 1983, pp. 597-599.

* cited by examiner

LOW TEMPERATURE THIN FILM TRANSISTOR PROCESS, DEVICE PROPERTY, AND DEVICE STABILITY IMPROVEMENT

CROSS-REFERENCE TO RELATED APPLICATIONS

This applications claims benefit of U.S. Provisional Patent Application Ser. No. 61/045,821 filed Apr. 17, 2008.

BACKGROUND OF THE INVENTION

1. Field of the Invention

Embodiments of the invention relate generally to a thin film transistor having stable electrical properties, and methods of making such a transistor.

2. Description of the Related Art

Thin film transistors (TFT's) are widely used to make flat panel displays of many sizes and types. In general, a thin film transistor is formed in layers on a substrate. A conductive bottom gate layer is covered by a dielectric material to support maintenance of an electric field between the conductive bottom gate layer and a top gate layer to be formed later. A semiconductive layer is generally formed over the dielectric layer. The semiconductive layer acts as a supplier of electrons to the transistor channel, which is a doped semiconductive material formed over the active layer. The top gate contact is formed over the channel layer.

In operation, a gate voltage is applied to the gate and a bias voltage is applied to the channel through source and drain junctions. The gate voltage produces an electric field through the transistor by virtue of the dielectric layer. The electric field encourages electrons to move from the active layer into the channel layer. When enough electrons have migrated, a current flows through the channel layer.

To ensure reliable operation of the TFT, mobility of electrons in the active layer is important. Electrons must be free to migrate from the active layer into the channel layer readily in response to an applied gate voltage. If electron mobility in the active layer declines, the gate voltage required to generate a current in the channel increases, potentially causing failure of the transistor. In addition, stability of properties such as threshold voltage under thermal and electrical stress is key to reliable operation.

Thus, there is a continuing need for a thin-film transistor with stable properties and high electron mobility.

SUMMARY OF THE INVENTION

Embodiments of the present invention generally provide a thin film transistor formed by depositing a dielectric layer, active layer, doped active layer, and conductive layer on a substrate. In one embodiment, the dielectric layer is a bilayer, having a silicon-rich silicon nitride layer as the first dielectric layer and a silicon nitride layer as the second dielectric layer. In another embodiment, the active layer is a bilayer, having a first amorphous silicon layer deposited at a low deposition rate, and a second amorphous silicon layer deposited at a higher deposition rate. In some embodiments, the thin film transistor has a refractive index at least about 1.90, a silicon:nitrogen ratio of at least about 0.83:1, and a content of Si—H bonds of between about 18 atomic percent and about 21 atomic percent.

Embodiments of the invention also provide a method of forming a thin film transistor, comprising sequentially forming a dielectric layer, an active layer, a doped active layer, and a conductive layer over a substrate. In some embodiments, the dielectric layer is formed from two layers, a first dielectric layer and a second dielectric layer. In some embodiments, the first dielectric layer is a silicon-rich silicon nitride layer. In other embodiments, the first dielectric layer is formed at a deposition rate lower than the second dielectric layer. In still other embodiments, the active layer is formed as two layers, a first amorphous silicon layer deposited at a low deposition rate, and a second amorphous silicon layer deposited at a higher rate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide a thin film transistor (TFT) and a method of making a TFT.

Figure 1:
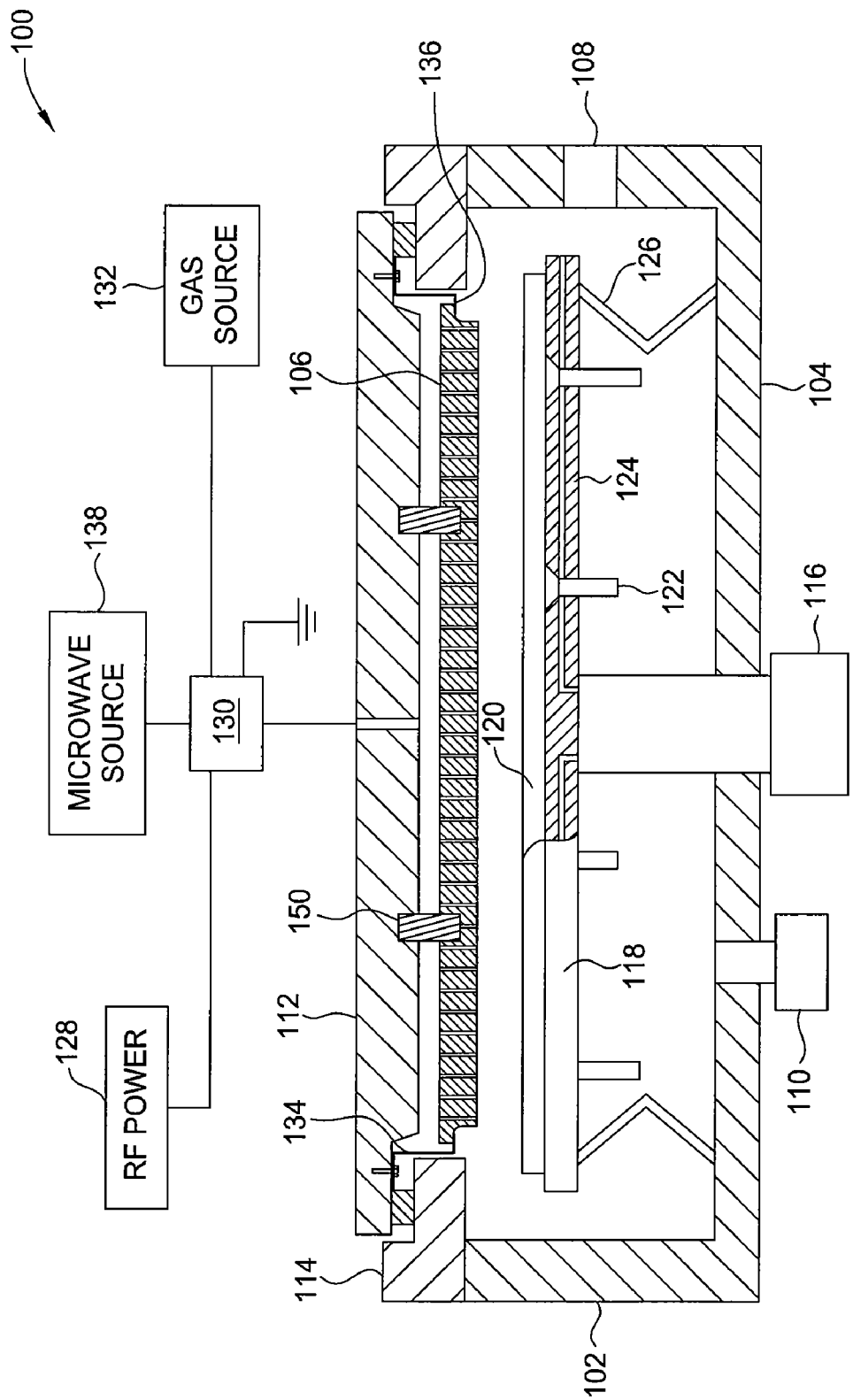
FIG. 1 is a cross sectional view of a PECVD apparatus according to one embodiment of the invention.

FIG. 1 is a cross sectional view of a PECVD apparatus according to one embodiment of the invention. The apparatus includes a chamber 100 in which one or more films may be deposited onto a substrate 120. One suitable PECVD apparatus which may be used is available from Applied Materials, Inc., located in Santa Clara, Calif. While the description below will be made in reference to a PECVD apparatus, it is to be understood that the invention is equally applicable to other processing chambers as well, including those made by other manufacturers.

The chamber 100 generally includes walls 102, a bottom 104, a showerhead 106, and susceptor 118 which define a process volume. The process volume is accessed through a slit valve opening 108 such that the substrate 120 may be transferred in and out of the chamber 100. The susceptor 118 may be coupled to an actuator 116 to raise and lower the susceptor 118. Lift pins 122 are moveably disposed through the susceptor 118 to support a substrate 120 prior to placement onto the susceptor 118 and after removal from the susceptor 118. The susceptor 118 may also include heating and/or cooling elements 124 to maintain the susceptor 118 at a desired temperature. The susceptor 118 may also include grounding straps 126 to provide RF grounding at the periphery of the susceptor 118.

The showerhead 106 is coupled to a backing plate 112 by a fastening mechanism. The showerhead 106 may be coupled to the backing plate 112 by one or more coupling supports 150 to help prevent sag and/or control the straightness/curvature of the showerhead 106. In one embodiment, twelve coupling supports 150 may be used to couple the showerhead 106 to the backing plate 112. The coupling supports 150 may include a fastening mechanism such as a nut and bolt assembly. In one embodiment, the nut and bolt assembly may be made with an electrically insulating material. In another embodiment, the bolt may be made of a metal and surrounded by an electrically insulating material. In still another embodiment, the showerhead 106 may be threaded to receive the bolt. In yet another embodiment, the nut may be formed of an electrically insulating material. The electrically insulating material helps to prevent the coupling supports 150 from becoming electrically coupled to any plasma that may be present in the chamber 100. Additionally and/or alternatively, a center coupling mechanism may be present to couple the backing plate 112 to the showerhead 106. The center coupling mechanism may surround a backing plate support ring (not shown) and be suspended from a bridge assembly (not shown). The showerhead 106 may additionally be coupled to the backing plate 112 by a bracket 134. The bracket 134 may have a ledge 136 upon which the showerhead 106 may rest. The backing plate 112 may rest on a ledge 114 coupled with the chamber walls 102 to seal the chamber 100.

A gas source 132 is coupled to the backing plate 112 to provide both processing gas and cleaning gas through gas passages in the showerhead 106 to the substrate 120. The processing gases travel through a remote plasma source/RF choke unit 130. A vacuum pump 110 is coupled to the chamber 100 at a location below the susceptor 118 to maintain the process volume at a predetermined pressure. A RF power source 128 is coupled to the backing plate 112 and/or to the showerhead 106 to provide a RF current to the showerhead 106. The RF current creates an electric field between the showerhead 106 and the susceptor 118 so that a plasma may be generated from the gases between the showerhead 106 and the susceptor 118. Various frequencies may be used, such as a frequency between about 0.3 MHz and about 200 MHz. In one embodiment, the RF current is provided at a frequency of 13.56 MHz.

Between processing substrates, a cleaning gas may be provided to the remote plasma source/RF choke unit 130 so that a remote plasma is generated and provided to clean the chamber 100 components. A microwave current from a microwave source 138 coupled to the remote plasma source/RF choke 130 may ignite the plasma. The cleaning gas may be further excited by the RF power source 128 provided to the showerhead 106. Suitable cleaning gases include but are not limited to $NF_3$, $F_2$, and $SF_6$. The spacing between the top surface of the substrate 120 and the showerhead 106 may be between about 400 mil and about 1,200 mil. In one embodiment, the spacing may be between about 400 mil and about 800 mil.

Figure 2:
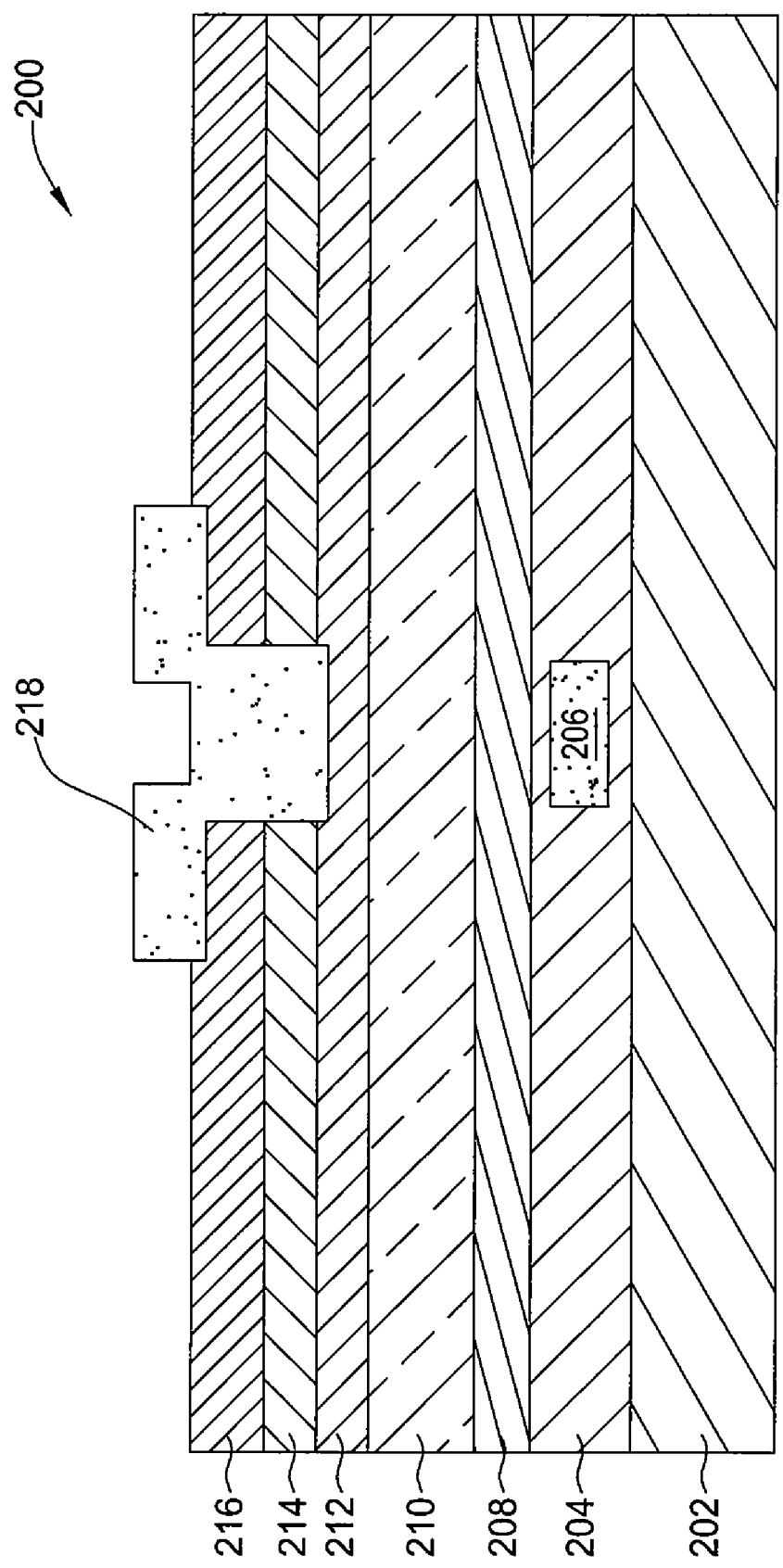
FIG. 2 is a schematic drawing of a TFT structure.

PECVD may be used to deposit various layers of a TFT. FIG. 2 is a schematic drawing of a TFT structure 200 according to one embodiment of the invention. The TFT structure 200 comprises a substrate 202, which may be any substrate upon which a silicon-containing dielectric layer can be formed. The substrate 202 may be conductive or non-conductive, and may be rigid or flexible. In some embodiments, the substrate 202 may be a glass substrate. In other embodiments, the substrate 202 may be a doped or otherwise modified glass substrate. The TFT structure 200 further comprises a first dielectric layer 204, a bottom gate layer 206, a second dielectric layer 208, a first active layer 210, a second active layer 212, a doped semiconductor layer 214, a metal layer 216, and a passivation layer 218.

The first dielectric layer 204 of the TFT structure 200 is generally deposited on the substrate 202 to a first thickness at a first deposition rate. In many embodiments, the first dielectric layer 204 of the TFT structure 200 will be a silicon nitride layer. In some embodiments, the first dielectric layer 204 may be a silicon rich silicon nitride layer, such as a silicon rich silicon nitride layer having a silicon:nitrogen ratio greater than about 0.80:1.0. In another embodiment, the silicon rich silicon nitride layer may have a silicon:nitrogen ratio greater than about 0.83:1.0. In yet another embodiment, the silicon rich silicon nitride layer may have a silicon:nitrogen ratio greater than about 0.85:1.0. Contrary to widespread belief that a silicon rich silicon nitride layer is a "bad nitride" layer, a silicon rich silicon nitride layer has been found to provide reduced negative threshold voltage shift in TFT's deposited at low temperature due to high defect density caused by an increase in the proportion of silicon-hydrogen bonds in the structure. These defects serve as electron traps, a high density of which is thought to reduce intrusion of electrons into the dielectric layer over time. Negative threshold voltage drift, which is a reduction of the threshold voltage over time, is thereby reduced.

The first dielectric layer 204 may be deposited to a first thickness between about 1000 Angstroms (Å) and about 4000 Å, such as between 2000 Å and about 3000 Å, for example about 2800 Å. In embodiments wherein the first dielectric layer is a silicon rich silicon nitride layer, the first dielectric layer 204 will have an index of refraction that is higher than standard silicon nitride films. Standard silicon nitride films have an index of refraction of about 1.8 to 1.9. In contrast, silicon rich silicon nitride films have an index of refraction of about 1.9 or greater. In some embodiments, the refractive index may be between about 1.92 and about 1.96. In some embodiments, a silicon rich silicon nitride layer such as that discussed in relation to the first dielectric layer 204 may have a higher content of Si—H bonds than N—H bonds. In other embodiments, the content of Si—H bonds may be lower than the content of N—H bonds. For example, in some embodiments, the content of Si—H bonds may be between about 18 atomic percent and about 30 atomic percent, such as between about 21 atomic percent and about 27 atomic percent. In other embodiments, the content of N—H bonds may be less than about 20 atomic percent, such as less than about 18 atomic percent.

The bottom gate layer 206 of the TFT structure 200 is generally deposited over or within the first dielectric layer 204. The bottom gate layer 206 generally comprises a metal, such as chromium, or a metal alloy, such as an aluminum neodymium alloy, and is deposited to a thickness between about 500 Å and about 3500 Å. The bottom gate layer may be a bilayer of two metals or alloys, which may be the same or different. For example, the bottom gate layer may be a bilayer of chromium and an aluminum neodymium alloy.

The second dielectric layer 208 may comprise a layer containing silicon, oxygen, nitrogen, carbon, or combinations thereof. For example, the second dielectric layer 208 may be silicon nitride, silicon oxide, or silicon carbide. Additionally, in some embodiments, the second dielectric layer may be silicon oxynitride, silicon oxycarbide, or silicon carbonitride. In embodiments wherein the second dielectric layer 208 is a silicon nitride layer, it may be a stoichiometric silicon nitride layer or a silicon rich silicon nitride layer. In some embodiments, the second dielectric layer 208 may have composition substantially similar to the first dielectric layer. In some embodiments, the second dielectric layer 208 may have a silicon:nitrogen ratio greater than that of the first dielectric layer 204. In other embodiments, the second dielectric layer 208 may have a silicon:nitrogen ratio that is less than the first dielectric layer 204. The second dielectric layer 208 is generally deposited to a second thickness between about 200 Å and about 1000 Å, such as between about 400 Å and about 600 Å, for example about 500 Å. The second thickness is generally less than the first thickness.

The first and the second dielectric layers together constitute a gate dielectric layer having low dielectric constant and good barrier properties. In addition, the gate dielectric layer supports good mobility of electrons through the TFT, and promotes stable electrical properties over time. The second dielectric layer thus formed will preferably have a low wet etch rate of between about 700 Å/min and about 3,000 Å/min, such as between about 1,000 Å/min and about 1,500 Å/min.

The first active layer 210 may be an amorphous silicon layer, a polysilicon layer, or a hydrogenated amorphous silicon layer. The first active layer 210 is generally deposited to a third thickness that may be between about 100 Å and about 500 Å, such as between about 200 Å and about 400 Å, for example about 300 Å. The first active layer 210 generally supplies electrons to the doped semiconductor layer 214 when a voltage is applied to the gate. The first active layer 210 may be a semiconductor material, such as silicon or germanium, or a mixture thereof, a doped semiconductor material, such as an n-doped or p-doped silicon material, or a transparent conductive oxide material, such as zinc oxide.

The second active layer 212 may also be an amorphous silicon layer, deposited to a fourth thickness between about 1200 Å and about 2000 Å, such as about 1400 Å to about 1800 Å, for example about 1600 Å. The fourth thickness is usually greater than the third thickness. The second active layer 212 may have composition substantially similar to the first active layer 210. The second active layer 212 may also be a semiconductor material, a doped semiconductor material, or a transparent conductive oxide, substantially as described above.

The doped semiconductor layer 214 generally forms a source drain region of the TFT 200. The doped semiconductor layer 214 will generally be an n-doped or p-doped silicon region. For example, the layer 214 may be an amorphous silicon region doped with one or more of boron, phosphorus, or arsenic. The metal layer 216 may be sputtered onto the layer 214, and a passivation layer 218 formed thereon. The passivation layer 218 may be a silicon nitride layer.

Figure 3:
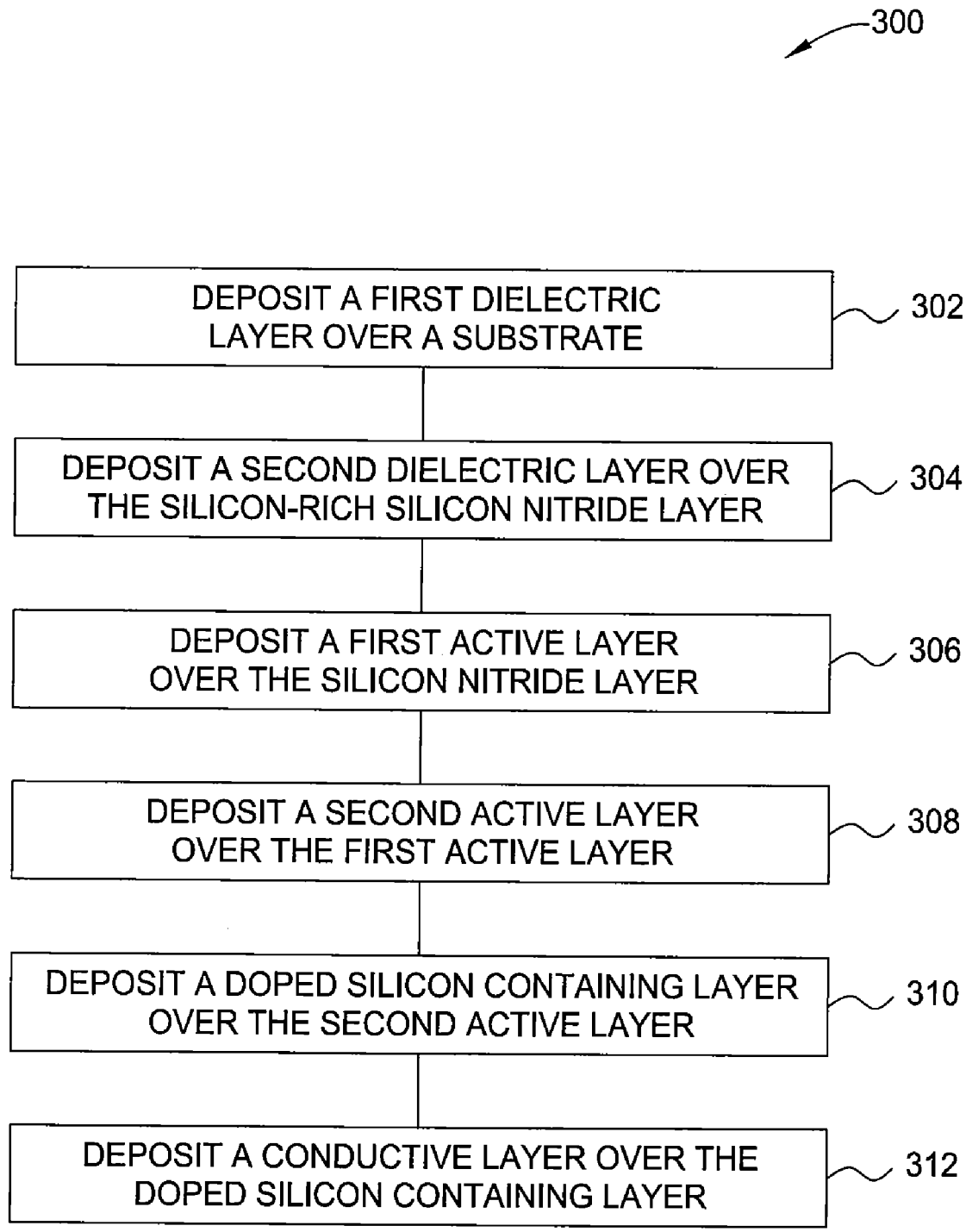
FIG. 3 is a flow diagram summarizing a method according to one embodiment.

Embodiments of the invention also provide a method of forming a TFT similar to that described above in connection with FIG. 2. FIG. 3 is a flowchart describing a method 300 according to an embodiment of the invention. A first dielectric layer, which may be a silicon rich silicon nitride layer, is deposited over a substrate in step 302. In an exemplary embodiment wherein the first dielectric layer is a silicon rich silicon nitride layer, the first dielectric layer is deposited by providing a substrate to a processing chamber such as that described in connection with FIG. 1 above. A first gas mixture is provided to the process chamber and a plasma created to deposit the first dielectric layer on the substrate. The gas mixture generally comprises a silicon source, such as silane ($SiH_4$) and a nitrogen source, such as nitrogen gas ($N_2$), ammonia ($NH_3$), or a mixture thereof. Additionally, a hydrogen source, such as hydrogen gas ($H_2$), and a carrier gas, such as argon (Ar), may supplement the first gas mixture. Ammonia may serve as the hydrogen source in some embodiments, as well.

In general, flowrate of gas mixtures to a process chamber will depend on the size of the substrate being processed. In some embodiments, such as an exemplary embodiment in which a substrate measuring 68 cm by 88 cm is processed, the first gas mixture may be provided at a flow rate between about 4,000 sccm to about 19,000 sccm, such as between about 7,000 sccm to about 11,000 sccm, for example about 9,000 sccm. In such an embodiment, the gas flow of $SiH_4$ gas is between about 300 to about 900 sccm, such as between about 400 sccm to about 700 sccm, for example about 550 sccm. The gas flow of $NH_3$ gas is between about 600 to about 2,400 sccm, such as between about 800 sccm and about 2,000 sccm, for example about 1,200 sccm. The gas flow of $N_2$ gas is between about 1,000 to about 7,000 sccm, such as between about 1,000 sccm and about 4,000 sccm, for example about 1,000 sccm. The gas flow of $H_2$ gas is between about 3,000 sccm and about 9,000 sccm, such as between about 5,000 sccm and about 7,000 sccm, for example about 6,000 sccm.

In some embodiments, the gas flow of the first gas mixture may be modulated to the area of the substrate. For example, in an exemplary embodiment, the first gas mixture may be provided at a specific flow rate of between about 0.8 sccm/cm$^2$ and about 3.1 sccm/cm$^2$, such as between about 1.0 sccm/cm$^2$ and about 2.0 sccm/cm$^2$, for example about 1.4 sccm/cm$^2$. In such an embodiment the gas flow of $SiH_4$ gas is between about 0.05 sccm/cm$^2$ and about 0.15 sccm/cm$^2$, such as between about 0.07 sccm/cm$^2$ and about 0.11 sccm/cm$^2$, for example about 0.09 sccm/cm$^2$. The gas flow of $NH_3$ gas is between about 0.10 sccm/cm$^2$ and about 0.40 sccm/cm$^2$, such as between about 0.16 sccm/cm$^2$ and about 0.24 sccm/cm$^2$, for example about 0.20 sccm/cm$^2$. The gas flow of $N_2$ gas is between about 0.17 sccm/cm$^2$ to about 1.1 sccm/cm$^2$, such as between about 0.17 sccm/cm$^2$ and about 0.5 sccm/cm$^2$, for example about 0.17 sccm/cm$^2$. The gas flow of $H_2$ gas is between about 0.5 sccm/cm$^2$ and about 1.5 sccm/cm$^2$, such as between about 0.7 sccm/cm$^2$ and about 1.3 sccm/cm$^2$, for example about 1.0 sccm/cm$^2$.

Furthermore, in some embodiments the first gas mixture features a gas flow ratio between $NH_3$ and $SiH_4$ ($NH_3:SiH_4$) of about 0.7:1 to about 7.4:1, such as about 1.5:1 to about 3.0:1, for example about 2.2:1. The gas flow ratio between $N_2$ and $SiH_4$ ($N_2:SiH_4$) is about 1:1 to about 21:1, such as about 1.5:1 to about 10:1, for example about 2:1. The gas flow ratio between $N_2$ and $NH_3$ ($N_2:NH_3$) is about 0.4:1 to about 11:1, such as between about 0.6:1 and about 4:1, for example about 0.8:1.

The first dielectric layer will generally be deposited at a first temperature between about 150° C. and about 250° C., such as about 200° C. Low deposition temperature allows formation of TFT's on a wide variety of substrates. A plasma is generally formed to enhance deposition, and is usually energized by application of RF power to the reaction zone at a frequency of 13.56 MHz and a power level between about 2,000 Watts (W) and 3,800 W, such as between about 2,400 W and about 3,200 W, for example about 2,700 W. Specific power applied by RF in some embodiments may be between about 0.30 W/cm$^2$ and about 0.70 W/cm$^2$, such as between about 0.35 W/cm$^2$ and about 0.55 W/cm$^2$, for example about 0.45 W/cm$^2$. The ratio of power to gas flow for the first gas mixture will generally be between about 0.2 W/sccm and about 0.4 W/sccm, such as about 0.33 W/sccm. Pressure in the chamber is generally maintained at less than about 4 Torr, such as between about 1.0 Torr and about 3.0 Torr, for example about 2.1 torr. In some embodiments, spacing between the electrode and the substrate is generally between about 450 mils and 1,000 mils, for example about 900 mils. These conditions result in deposition of the first dielectric layer at a first rate that is relatively high, such as between about 700 Å/min and about 2,000 Å/min, for example about 1,500 Å/min. The first dielectric layer will be deposited to a first thickness between about 1,000 Å and about 4,000 Å, such as between about 2,000 Å and about 3,000 Å, for example about 2,800Å.

A second dielectric layer is formed in step 304. The second dielectric layer may be formed in the same process chamber as the first dielectric layer, or in a different process chamber, depending on particular needs of individual embodiments. The second dielectric layer may be silicon nitride, silicon oxide, or silicon carbide. Additionally, in some embodiments, the second dielectric layer may be silicon oxynitride, silicon oxycarbide, or silicon carbonitride. In an exemplary embodiment wherein the second dielectric layer is a silicon nitride layer, the second dielectric layer may be formed by a process similar to that of the first dielectric layer, with substantially the same precursors and process conditions. Precursor levels may be altered to form a layer with different composition in some embodiments. For example, if the first dielectric layer is a silicon rich silicon nitride layer, and the second dielectric layer is a silicon nitride layer, as described in connection with FIG. 2 above, flow rate of the silicon source may be reduced, or flowrate of the nitrogen source increased, to achieve the desired film composition.

In some embodiments, the second dielectric layer may be formed by providing a second gas mixture to a process chamber and creating a plasma to deposit the second dielectric layer. The second gas mixture generally comprises a silicon source, such as silane ($SiH_4$) and a nitrogen source, such as nitrogen gas ($N_2$), ammonia ($NH_3$), or a mixture thereof. Additionally, a hydrogen source, such as hydrogen gas ($H_2$), and a carrier gas, such as argon (Ar), may supplement the second gas mixture. Ammonia may serve as the hydrogen source in some embodiments, as well.

In general, flowrate of gas mixtures to a process chamber will depend on the size of the substrate being processed. In some embodiments, such as an exemplary embodiment in which a substrate measuring 68 cm by 88 cm is processed, the second gas mixture may be provided at a flow rate higher than the flow rate of the first gas mixture, between about 8,000 sccm to about 20,000 sccm, such as between about 10,000 sccm to about 18,000 sccm, for example about 14,000 sccm. In some embodiments, the flow rate of the second gas mixture is between 20% and 100% higher than the flow rate of the first gas mixture, such as between about 60% and 70% higher than the flow rate of the first gas mixture, for example about 65% higher than the flow rate of the first gas mixture. In other embodiments, the second gas mixture may be provided at a flow rate that is less than the flow rate of the first gas mixture. In embodiments featuring the aforementioned substrate size, the gas flow of $SiH_4$ gas is between about 140 to about 360 sccm, such as between about 200 sccm and about 420 sccm, for example about 250 sccm. The gas flow of $NH_3$ gas is between about 600 to about 1,700 sccm, such as between about 800 sccm and about 1,300 sccm, for example about 1,050. The gas flow of $N_2$ gas is between about 4,000 to about 10,000 sccm, such as between about 6,000 sccm and about 8,000 sccm, for example about 7,000. In this embodiment, the gas flow of $H_2$ gas is between about 3,500 sccm and about 8,500 sccm, such as between about 4,500 sccm and about 7,500 sccm, for example about 6,000 sccm.

In some embodiments, specific flow rate of the second gas mixture is between about 1.4 sccm/$cm^2$ and about 3.3 sccm/$cm^2$, such as between about 2.0 sccm/$cm^2$ and about 2.8 sccm/$cm^2$, for example about 2.4 sccm/$cm^2$. Specific flow rate of $SiH_4$ gas is between about 0.02 sccm/$cm^2$ and about 0.07 sccm/$cm^2$, such as between about 0.03 sccm/$cm^2$ and about 0.05 sccm/$cm^2$, for example about 0.04 sccm/$cm^2$. Specific flow rate of $NH_3$ gas is between about 0.10 sccm/$cm^2$ and about 0.30 sccm/$cm^2$, such as between about 0.14 sccm/$cm^2$ and about 0.22 sccm/$cm^2$, for example about 0.18 sccm/$cm^2$. Specific flow rate of $N_2$ gas is between about 0.7 sccm/$cm^2$ and about 1.7 sccm/cm2, such as between about 0.9 sccm/$cm^2$ and about 1.5 sccm/$cm^2$, for example about 1.2 sccm/$cm^2$. Specific flow rate of $H_2$ gas is between about 0.5 sccm/$cm^2$ and about 1.4 sccm/$cm^2$, such as between about 0.8 sccm/$cm^2$ and about 1.2 sccm/$cm^2$, for example about 1.0 sccm/$cm^2$.

Furthermore, in some embodiments, the second gas mixture features a gas flow ratio between $NH_3$ and $SiH_4$ ($NH_3$:$SiH_4$) of about 1:1 to about 12:1, such as between about 2:1 and about 6:1, for example about 4:1. The gas flow ratio between $N_2$ and $SiH_4$ ($N_2$:$SiH_4$) is about 10:1 to about 70:1, such as between about 25:1 and about 35:1, for example about 30:1. The gas flow ratio between $N_2$ and $NH_3$ ($N_2$:$NH_3$) is between about 2:1 to about 16:1, such as between about 4:1 and about 11:1, for example about 6.5:1. The second dielectric layer is generally deposited as a rate that is less than that of the first dielectric layer.

The second dielectric layer will generally be deposited at a second temperature substantially the same as the first temperature, between about 150° C. and about 250° C., such as about 200° C. A plasma is generally used to enhance deposition, and is usually energized by application of RF power to the reaction zone at a frequency of 13.56 MHz and a power level between about 900 Watts (W) and 2,100 W, such as between about 1,200 W and about 1,800 W, for example about 1,500 W. Specific power applied by RF in some embodiments of the second dielectric layer may be between about 0.15 W/$cm^2$ and about 0.35 W/$cm^2$, such as between about 0.20 W/$cm^2$ and about 0.30 W/$cm^2$, for example about 0.25 W/$cm^2$. The ratio of power to gas flow for the second gas mixture will generally be between about 0.09 W/sccm and about 0.11 W/sccm, such as about 0.10 W/sccm. Pressure in the chamber is generally maintained at less than about 4 Torr, such as between about 0.6 Torr and about 2.0 Torr, for example about 1.0 Torr. In some embodiments, spacing between the electrode and the substrate is generally between about 450 mils and 900 mils, for example about 600 mils. These conditions generally result in a deposition rate for the second dielectric layer that is less than that of the first dielectric layer. In some embodiments, the second dielectric layer may be deposited at a rate that is between about 40% and about 60% of the deposition rate of the first dielectric layer. In exemplary embodiments described above, the deposition rate of the second dielectric layer will be between about 400 Å/min and about 1,000 Å/min, such as between about 500 Å/min and about 900 Å/min, for example about 650 Å/min.

In embodiments wherein the second dielectric layer is a silicon nitride layer, it may be a stoichiometric silicon nitride layer or a silicon rich silicon nitride layer. In some embodiments, the second dielectric layer may have composition substantially similar to the first dielectric layer. In some embodiments, the second dielectric layer may have a silicon:nitrogen ratio greater than that of the first dielectric layer. In other embodiments, the second dielectric layer may have a silicon:nitrogen ratio that is less than the first dielectric layer. The second dielectric layer is generally deposited to a second thickness between about 200 Å and about 1000 Å, such as between about 400 Å and about 600 Å, for example about 500 Å. The second thickness is generally less than the first thickness.

A first active layer is formed in step 306. The first active layer may be an amorphous silicon layer, a polysilicon layer, a hydrogenated amorphous silicon layer, or a transparent conductive oxide layer, such as zinc oxide, as described above in connection with FIG. 2. The first active layer may be a semiconductor material, such as silicon or germanium, or a doped semiconductor material, such as an n-doped or p-doped silicon material. In an exemplary embodiment wherein the first active layer is an amorphous silicon layer, a third gas mixture is provided to a process chamber, which may be the same process chamber used to form the previous dielectric layers. The third gas mixture comprises a silicon source, such as a silane, an alkyl silane, a siloxane, a silazane, a silanol, or other linear or cyclic silicon sources. The third gas mixture may also comprise a hydrogen source different from the silicon source, such as hydrogen gas.

In an exemplary embodiment wherein the silicon source is silane ($SiH_4$) and the hydrogen source is hydrogen gas ($H_2$), and the substrate size is the same as embodiments described above, the flow rate of the third gas mixture may be between about 5,000 sccm to about 35,000 sccm, such as between about 7,000 sccm to about 20,000 sccm, for example about 11,000 sccm. The gas flow of $SiH_4$ gas is between about 400 to about 1,400 sccm, such as between about 600 sccm and about 1,000 sccm, for example, about 800 sccm. The gas flow of $H_2$ gas is between about 4,000 to about 30,000 sccm, such as between about 7,000 sccm and about 13,000 sccm, for example, about 10,000 sccm.

In some embodiments, the specific flow rate of the third gas mixture is between about 0.8 sccm/$cm^2$ and about 6.0 sccm/$cm^2$, such as between about 1.5 sccm/$cm^2$ and about 2.5 sccm/$cm^2$, for example about 1.8 sccm/$cm^2$. The specific flow rate of $SiH_4$ gas is between about 0.08 sccm/$cm^2$ and about 0.22 sccm/$cm^2$, such as between about 0.12 sccm/$cm^2$ and about 0.16 sccm/$cm^2$, for example about 0.14 sccm/$cm^2$. The specific flow rate of $H_2$ gas is between about 0.8 sccm/$cm^2$ and about 5.0 sccm/$cm^2$, such as between about 1.2 sccm/$cm^2$ and 2.5 sccm/$cm^2$, for example about 1.7 sccm/$cm^2$. Furthermore, the gas flow ratio between $H_2$ and SiH4 ($H_2$:SiH4) is between about 4:1 and about 60:1, for example about 12:1.

In some embodiments, the first active layer will be deposited at a temperature generally similar to that for the foregoing layers, between about 150° C. and about 250° C., such as about 200° C. A plasma is generally used, with RF power of 13.56 MHz applied at power levels between about 100 W and about 700 W, such as between about 300 W and about 500 W, for example about 350 W. Specific power in some embodiments will be between about 0.017 W/$cm^2$ and about 0.12 W/$cm^2$, such as between about 0.030 W/$cm^2$ and about 0.070 W/$cm^2$, for example about 0.057 W/$cm^2$. The ratio of power to gas flow for the third gas mixture will generally be between about 0.01 W/sccm and about 0.04 W/sccm, such as about 0.03 W/sccm. The process pressure is maintained at less than about 5 Torr, such as between about 1.0 Torr and 5.0 Torr, for example about 2.5 Torr. In some embodiments, spacing between the electrode and the substrate is generally between about 400 mils and 900 mils, for example about 550 mils. These conditions generally result in a low deposition rate for the first active layer. A low deposition rate is attractive to preserve electron mobility for the active layer as a whole. In exemplary embodiments described above, the deposition rate of the first active layer will be between about 80 Å/min and about 500 Å/min, for example about 200 Å/min. The first active layer will be deposited to a third thickness, which in some embodiments may be between about 100 Å and about 500 Å, such as between about 200 Å and about 400 Å, for example about 300 Å.

A second active layer is formed in step 308. The second active layer may be an amorphous silicon layer, a polysilicon layer, a hydrogenated amorphous silicon layer, or a transparent conductive oxide layer, such as zinc oxide, as described above in connection with FIG. 2. The second active layer may be a semiconductor material, such as silicon or germanium, or a doped semiconductor material, such as an n-doped or p-doped silicon material. In an exemplary embodiment wherein the second active layer is an amorphous silicon layer, a fourth gas mixture is provided to a process chamber, which may be the same process chamber used to form the previous dielectric and active layers, or a different process chamber. The fourth gas mixture comprises a silicon source, such as a silane, an alkyl silane, a siloxane, a silazane, a silanol, or other silicon sources. The fourth gas mixture may also comprise a hydrogen source different from the silicon source, such as hydrogen gas.

In an exemplary embodiment wherein the silicon source is silane ($SiH_4$) and the hydrogen source is hydrogen gas ($H_2$), with substrate size as exemplified in embodiments described above, the flow rate of the fourth gas mixture may be between about 3,000 sccm to about 12,000 sccm, such as between about 6,000 sccm and about 8,000 sccm, for example about 7,000 sccm. The gas flow of $SiH_4$ gas is between about 500 to about 2,200 sccm, such as between about 700 sccm and about 1,100 sccm, for example about 900 sccm. The gas flow of $H_2$ gas is between about 3,000 to about 10,000 sccm, such as between about 5,000 sccm to about 7,000 sccm, for example about 6,000 sccm.

In some embodiments, the specific flow rate of the fourth gas mixture is between about 0.5 sccm/$cm^2$ and about 2.0 sccm/$cm^2$, such as between about 0.9 sccm/$cm^2$ and about 1.3 sccm/$cm^2$, for example about 1.1 sccm/$cm^2$. The specific flow rate of $SiH_4$ gas is between about 0.08 sccm/$cm^2$ and about 0.40 sccm/$cm^2$, such as between about 0.13 sccm/$cm^2$ and about 0.20 sccm/$cm^2$, for example about 0.15 sccm/$cm^2$. The specific flow rate of $H_2$ gas is between about 0.4 sccm/$cm^2$ and about 1.6 sccm/$cm^2$, such as between about 0.8 sccm/$cm^2$ and 1.2 sccm/$cm^2$, for example about 1.0 sccm/$cm^2$. Furthermore, the gas flow ratio between $H_2$ and $SiH_4$ ($H_2$:$SiH_4$) is between about 1:1 to about 18:1, for example about 7:1.

In some embodiments, the second active layer will be deposited at a temperature generally similar to that for the foregoing layers, between about 150° C. and about 250° C., such as about 200° C. A plasma is generally used, with RF power of 13.56 MHz applied at power levels between about 400 W and about 2,000 W, such as between about 500 W and about 900 W, for example about 750 W. Specific power in some embodiments will be between about 0.07 W/$cm^2$ and about 0.40 W/$cm^2$, such as between about 0.09 W/$cm^2$ and about 0.20 W/$cm^2$, for example about 0.12 W/$cm^2$. The ratio of power to gas flow for the fourth gas mixture will generally be between about 0.05 W/sccm and about 0.15 W/sccm, such as about 0.11 W/sccm. The process pressure is maintained at less than about 5 Torr, such as between about 1.0 Torr and 5.0 Torr, for example about 2.1 Torr. In some embodiments, spacing between the electrode and the substrate is generally between about 400 mils and 900 mils, for example about 500 mils. These conditions generally result in a relatively high deposition rate for the second active layer. The deposition rate of the second active layer will generally be higher than that of the first active layer, and may be higher or lower than the deposition rates of the first or second dielectric layers. In exemplary embodiments described above, the deposition rate of the second active layer will be between about 500 Å/min and about 1,800 Å/min, for example about 700 Å/min. The second active layer will be deposited to a fourth thickness, which in some embodiments may be between about 1,200 Å and about 2,000 Å, such as between about 1,500 Å and about 1,700 Å, for example about 1,600 Å.

A doped silicon containing layer is deposited over the second active layer in step 310. The doped silicon containing layer may be an n-doped or p-doped amorphous silicon layer. In other embodiments, the doped silicon containing layer may be a mixed silicon-germanium layer doped with n-type or p-type dopants. The doped silicon layer may serve as the channel layer for a transistor, such as the thin-film transistor discussed in connection with FIG. 2, above. The dopants used may be selected from the group consisting of boron, phosphorus, arsenic, and combinations thereof. In an exemplary embodiment in which the doped silicon containing layer is an n-doped amorphous silicon layer, a fifth gas mixture is provided to a process chamber, which may be the same process chamber used to form the previous dielectric and active layers, or a different process chamber. The fifth gas mixture comprises a silicon source, such as a silane, an alkyl silane, a siloxane, a silazane, a silanol, or other silicon sources, along with an n-type dopant. In an exemplary embodiment, the n-type dopant may be a phosphorus containing precursor, such as phosphine ($PH_3$) or oligomers of phosphine. The fifth gas mixture may also comprise a hydrogen source different from the silicon source, such as hydrogen gas.

In an exemplary embodiment wherein the silicon source is silane ($SiH_4$), the hydrogen source is hydrogen gas ($H_2$), and the dopant precursor is phosphine ($PH_3$), with substrate size as exemplified in embodiments described above, the flow rate of the fifth gas mixture may be between about 3,000 sccm to about 20,000 sccm, such as between about 6,000 sccm and about 17,000 sccm, for example about 11,500 sccm. The gas flow of $SiH_4$ gas is between about 500 to about 1,400 sccm, such as between about 700 sccm and about 1,100 sccm, for example about 900 sccm. The gas flow of $H_2$ gas is between about 3,000 to about 15,000 sccm, such as between about 5,000 sccm to about 13,000 sccm, for example about 9,500 sccm. The gas flow rate of $PH_3$ gas is between about 100 sccm and about 3,000 sccm, such as between about 300 sccm and about 2,000 sccm, for example about 1,000 sccm.

In some embodiments, the specific flow rate of the fifth gas mixture is between about 0.6 sccm/$cm^2$ and about 2.0 sccm/$cm^2$, such as between about 0.9 sccm/$cm^2$ and about 1.9 sccm/$cm^2$, for example about 1.9 sccm/$cm^2$. The specific flow rate of $SiH_4$ gas is between about 0.08 sccm/$cm^2$ and about 0.24 sccm/$cm^2$, such as between about 0.11 sccm/$cm^2$ and about 0.17 sccm/$cm^2$, for example about 0.14 sccm/$cm^2$. The specific flow rate of $H_2$ gas is between about 0.5 sccm/$cm^2$ and about 2.5 sccm/$cm^2$, such as between about 1.0 sccm/$cm^2$ and 2.0 sccm/$cm^2$, for example about 1.5 sccm/$cm^2$. The specific flow rate of $PH_3$ gas is between about 0.03 sccm/$cm^2$ and about 0.5 sccm/$cm^2$, such as between about 0.04 sccm/$cm^2$ and about 0.30 sccm/$cm^2$, for example about 0.17 sccm/$cm^2$. Furthermore, the gas flow ratio between $H_2$ and $SiH_4$ ($H_2$:$SiH_4$) is between about 2:1 to about 36:1, for example about 13:1, and the gas flow ratio between $H_2$ and $PH_3$ is generally about 10:1 (i.e. about 0.5% $PH_3$ in $H_2$ by volume).

In some embodiments, the doped silicon containing layer will be deposited at a temperature generally similar to that for the foregoing layers, between about 150° C. and about 250° C., such as about 200° C. A plasma is generally used, with RF power of 13.56 MHz applied at power levels between about 100 W and about 600 W, such as between about 200 W and about 500 W, for example about 350 W. Specific power in some embodiments will be between about 0.01 W/$cm^2$ and about 0.10 W/$cm^2$, such as between about 0.03 W/$cm^2$ and about 0.08 W/$cm^2$, for example about 0.06 W/$cm^2$. The ratio of power to gas flow for the fifth gas mixture will generally be between about 0.02 W/sccm and about 0.04 W/sccm, such as about 0.03 W/sccm. The process pressure is maintained at less than about 5 Torr, such as between about 1.5 Torr and 5 Torr, for example about 2.5 Torr. In some embodiments, spacing between the electrode and the substrate is generally between about 400 mils and 900 mils, for example about 550 mils. These conditions generally result in a deposition rate for the doped silicon containing layer that is higher than that of the first active layer, but lower than that of the second active layer. In exemplary embodiments described above, the deposition rate of the doped silicon containing layer will be between about 100 Å/min and about 500 Å/min, for example about 200 Å/min. The doped silicon containing layer will be deposited to a fifth thickness, which in some embodiments may be between about 200 Å and about 600 Å, such as between about 300 Å and about 500 Å, for example about 400 Å.

A conductive layer is formed over the doped silicon containing layer in step 312. The conductive layer may be a metal or metal alloy, and may be deposited by sputtering according to techniques well known to the art. A passivation layer may also be formed over the conductive layer. In some embodiments, the passivation layer may be a silicon and nitrogen containing layer, such as silicon nitride, and may also be formed by techniques well known to the art.

The steps of method 300 may be performed in the same process chamber or in different process chambers, depending on the particular embodiment. In some embodiments, it may be advantageous to perform steps 302-310 in a single process chamber, for example.

EXAMPLES

In a first example, a TFT was formed by depositing a silicon rich silicon nitride layer over a substrate having a bottom gate layer formed thereon. The silicon rich silicon nitride layer was deposited to a thickness of about 2800 Å. A silicon nitride layer was formed in the same process chamber over the silicon rich silicon nitride layer to a depth of about 500 Å. A first amorphous silicon layer was formed to a thickness of about 300 Å over the silicon nitride layer. A second active layer of amorphous silicon was then deposited at a high deposition rate over the first active layer to a thickness of about 1600 Å in the same process chamber. A doped amorphous silicon layer about 400 Å thick was deposited over that, again in the same chamber. Metal contacts and passivation layer were added on top. Process conditions for the various deposition steps are given below in Table 1.

TABLE 1

| | Process Conditions for Example 1 | | | | | | | | |
|---|---|---|---|---|---|---|---|---|---|
| Layer | $SiH_4$ Rate (sccm) | $NH_3$ Rate (sccm) | $N_2$ Rate (sccm) | $H_2$ Rate (sccm) | $PH_3$ Rate (sccm) | Power (W) | Pressure (Torr) | Spacing (mils) | Temp. (C.) | Dep. Rate (Å/min) |
| Dielectric 1 | 540 | 1197 | 1000 | 5900 | 0 | 2692 | 2.1 | 900 | 200 | 1455 |
| Dielectric 2 | 247 | 1060 | 7070 | 5900 | 0 | 1473 | 1.0 | 580 | 200 | 651 |
| Active 1 | 831 | 10388 | 0 | 0 | 0 | 338 | 2.5 | 550 | 200 | 215 |
| Active 2 | 880 | 0 | 0 | 5900 | 0 | 741 | 2.1 | 500 | 200 | 682 |
| NP Active | 830 | 0 | 0 | 9500 | 1000 | 338 | 2.5 | 550 | 200 | 230 |

The resulting TFT exhibited threshold voltage of 0.10 volts, on-current of 2.98 microamperes (μA), off-current of 4.05 picoamperes (pA), mobility of 0.8 cm$^2$/V-sec, and sub-threshold swing of 0.62 V/dec.

Process conditions shown for formation of two comparison examples are shown in Tables 2 and 3. Properties of the resulting TFT's are shown in Table 4. Properties of the TFT produced in Example 1 are also included in Table 4 for easy comparison. Table 5 summarizes bias temperature stress data for each of the examples taken at 80° C. and +/−40V bias gate voltage, which show the improvement in threshold voltage shift for Example 1 over the comparison examples.

TABLE 2

Process Conditions for Comparison Example 1

| Layer | SiH$_4$ Rate (sccm) | NH$_3$ Rate (sccm) | N$_2$ Rate (sccm) | H$_2$ Rate (sccm) | PH$_3$ Rate (sccm) | Power (W) | Pressure (Torr) | Spacing (mils) | Temp. (C.) | Dep. Rate (Å/min) |
|---|---|---|---|---|---|---|---|---|---|---|
| Dielectric 1 | 540 | 1196.8 | 4488 | 5900 | 0 | 2692 | 2.1 | 900 | 200 | 1500 |
| Dielectric 2 | 247 | 1060 | 7070 | 5900 | 0 | 1473 | 1.0 | 580 | 200 | 650 |
| Active 1 | 830 | 0 | 0 | 10000 | 0 | 340 | 2.5 | 550 | 200 | 215 |
| Active 2 | 880 | 0 | 0 | 5900 | 0 | 740 | 2.1 | 500 | 200 | 666 |
| NP Active | 880 | 0 | 0 | 5605 | 295 | 740 | 2.1 | 500 | 200 | 656 |

TABLE 3

Process Conditions for Comparison Example 2

| Layer | SiH$_4$ Rate (sccm) | NH$_3$ Rate (sccm) | N$_2$ Rate (sccm) | H$_2$ Rate (sccm) | PH$_3$ Rate (sccm) | Power (W) | Pressure (Torr) | Spacing (mils) | Temp. (C.) | Dep. Rate (Å/min) |
|---|---|---|---|---|---|---|---|---|---|---|
| Dielectric 1 | 600 | 2670 | 6670 | 0 | 0 | 3050 | 1.5 | 1090 | 345 | 1808 |
| Dielectric 2 | 290 | 1800 | 11800 | 0 | 0 | 2200 | 1.2 | 550 | 345 | 1015 |
| Active 1 | 660 | 0 | 0 | 2400 | 0 | 430 | 3.0 | 480 | 345 | 615 |
| Active 2 | 1000 | 0 | 0 | 3500 | 0 | 850 | 3.0 | 480 | 345 | 1170 |
| NP Active | 1000 | 0 | 0 | 2560 | 1900 | 760 | 3.0 | 500 | 345 | 1023 |

TABLE 4

Properties of Comparison TFT's

| Specimen | Mobility (cm$^2$/V-sec) | V$_{th}$ (V) | I$_{off}$ (pA) | I$_{on}$ (μA) | I$_{on}$/i$_{off}$ | S (V/dec) |
|---|---|---|---|---|---|---|
| Example 1 | 0.73 | 1.40 | 0.11 | 5.60 | 5.09 × 10$^7$ | 0.71 |
| Comp. 1 | 0.70 | 1.30 | 1.70 | 5.50 | 3.24 × 10$^6$ | 0.73 |
| Comp. 2 | 0.8 | 0.90 | 0.37 | 6.50 | 1.76 × 10$^7$ | 0.67 |

TABLE 5

Bias Temperature Stress Data

| Specimen | ΔV$_{th}$, +40 V Bias (Volt) | ΔV$_{th}$, −40 V Bias (Volt) | Δμ/μ$_0$, +40 V Bias | Δμ/μ$_0$, −40 V Bias | ΔS, +40 V Bias (V/dec) | ΔS, −40 V Bias (V/dec) |
|---|---|---|---|---|---|---|
| Example 1 | 15.3 | −6.9 | −38.1% | −35.4% | 1.01 | 0.81 |
| Comp. 1 | 18.8 | −15.0 | −34.4% | −8.3% | 0.66 | 0.29 |
| Comp. 2 | 16.0 | −9.6 | −38.1% | −39.8% | 1.15 | 1.36 |

Thus, the methods described herein advantageously improve the electron mobility, stability and uniformity of TFT devices by controlling the film properties of the gate dielectric layer and semiconductor layer.

While the foregoing is directed to embodiments of the present invention, other and further embodiments of the invention may be devised without departing from the basic scope thereof, and the scope thereof is determined by the claims that follow.

What is claimed is:

1. A method of forming a thin film transistor, comprising:
   forming a silicon-rich silicon nitride layer over a substrate at a first rate;
   forming a silicon nitride layer over the silicon-rich silicon nitride layer at a second rate;
   forming a first amorphous silicon layer over the silicon nitride layer at a third rate; and
   forming a second amorphous silicon layer over the first amorphous silicon layer at a fourth rate, wherein the third rate is less than the fourth rate.

2. The method of claim 1, wherein the second rate is less than the first rate.

3. The method of claim 1, wherein the silicon-rich silicon nitride layer has a silicon to nitrogen ratio greater than about 0.83:1.

4. The method of claim 1, wherein the silicon-rich silicon nitride layer has a silicon to hydrogen bond content between about 18 atomic percent and about 30 atomic percent.

5. The method of claim 1, wherein the silicon-rich silicon nitride layer is thicker than the silicon nitride layer.

6. The method of claim 1, wherein the second amorphous silicon layer is thicker than the first amorphous silicon layer.

7. The method of claim 2, wherein the silicon-rich silicon nitride layer has a silicon to nitrogen ratio greater than about 0.83:1.

8. A method of forming a thin film transistor, comprising:
   forming a silicon-rich silicon nitride layer on a substrate at a first rate to a first thickness;
   forming a bottom gate layer comprising metal over the silicon-rich silicon nitride layer;
   forming a silicon nitride layer over the bottom gate layer at a second rate to a second thickness;
   forming a first amorphous silicon layer over the silicon nitride layer at a third rate to a third thickness;
   forming a second amorphous silicon layer over the first amorphous silicon layer at a fourth rate to a fourth thickness;
   forming a doped silicon containing layer over the second amorphous silicon layer to a fifth thickness; and
   forming a conductive contact layer over the doped silicon containing layer.

9. The method of claim 8, wherein the second rate is less than the first rate and the third rate is less than the fourth rate.

10. The method of claim 8, wherein the second thickness is less than the first thickness and the third thickness is less than the fourth thickness.

11. The method of claim 8, wherein the silicon-rich silicon nitride layer and the silicon nitride layer are deposited in the same chamber.

12. The method of claim 11, wherein the silicon-rich silicon nitride layer has a silicon to nitrogen ratio greater than about 0.83:1.

13. The method of claim 12, wherein the silicon-rich silicon nitride layer has a silicon to hydrogen bond content between about 18 atomic percent and about 30 atomic percent.

* * * * *